(12) United States Patent
Yu et al.

(10) Patent No.: US 10,964,666 B2
(45) Date of Patent: Mar. 30, 2021

(54) CHIP ON PACKAGE STRUCTURE AND METHOD

(71) Applicant: Taiwan Semiconductor Manufacturing Company, Ltd., Hsinchu (TW)

(72) Inventors: Chen-Hua Yu, Hsinchu (TW); Der-Chyang Yeh, Hsinchu (TW); Kuo-Chung Yee, Taoyuan (TW); Jui-Pin Hung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 231 days.

(21) Appl. No.: 15/645,487

(22) Filed: Jul. 10, 2017

(65) Prior Publication Data
US 2017/0309596 A1    Oct. 26, 2017

Related U.S. Application Data

(63) Continuation of application No. 15/186,624, filed on Jun. 20, 2016, now Pat. No. 9,704,826, which is a
(Continued)

(51) Int. Cl.
*H01L 25/065*    (2006.01)
*H01L 21/48*    (2006.01)
(Continued)

(52) U.S. Cl.
CPC ........ *H01L 25/0652* (2013.01); *H01L 21/486* (2013.01); *H01L 21/4853* (2013.01);
(Continued)

(58) Field of Classification Search
CPC ........... H01L 2924/181; H01L 2224/97; H01L 21/56; H01L 23/3121; H01L 25/50;
(Continued)

(56) References Cited

U.S. PATENT DOCUMENTS 5,600,541 A    2/1997    Bone et al.
5,977,640 A    11/1999    Bertin et al.
(Continued)

FOREIGN PATENT DOCUMENTS

CN    101315924 A    12/2008
CN    102034718 A    4/2011
(Continued)

OTHER PUBLICATIONS

Cheah, Bok Eng, et al., "A Novel Inter-Package Connection for Advanced Package-on-Package Enabling," IEEE Electronic Components and Technology Conference, May 31, 2011-Jun. 3, 2011, pp. 589-594.
(Continued)

*Primary Examiner* — Jesse Y Miyoshi
(74) *Attorney, Agent, or Firm* — Slater Matsil, LLP

(57) ABSTRACT

A system and method for packaging semiconductor device is provided. An embodiment comprises forming vias over a carrier wafer and attaching a first die over the carrier wafer and between a first two of the vias. A second die is attached over the carrier wafer and between a second two of the vias. The first die and the second die are encapsulated to form a first package, and at least one third die is connected to the first die or the second die. A second package is connected to the first package over the at least one third die.

20 Claims, 10 Drawing Sheets

Related U.S. Application Data continuation of application No. 14/147,316, filed on Jan. 3, 2014, now Pat. No. 9,373,527.

(60) Provisional application No. 61/897,695, filed on Oct. 30, 2013.

(51) Int. Cl.

| | | |
|---|---|---|
| *H01L 21/56* | (2006.01) | |
| *H01L 21/683* | (2006.01) | |
| *H01L 25/10* | (2006.01) | |
| *H01L 23/498* | (2006.01) | |
| *H01L 23/538* | (2006.01) | |
| *H01L 21/78* | (2006.01) | |
| *H01L 23/31* | (2006.01) | |
| *H01L 23/48* | (2006.01) | |
| *H01L 21/768* | (2006.01) | |
| *H01L 23/00* | (2006.01) | |
| *H01L 25/00* | (2006.01) | |
| H01L 21/027 | (2006.01) | |
| H01L 21/288 | (2006.01) | |
| H01L 21/321 | (2006.01) | |
| H01L 21/66 | (2006.01) | |

(52) U.S. Cl.
CPC .......... *H01L 21/561* (2013.01); *H01L 21/568* (2013.01); *H01L 21/6835* (2013.01); *H01L 21/6836* (2013.01); *H01L 21/78* (2013.01); *H01L 23/3107* (2013.01); *H01L 23/481* (2013.01); *H01L 23/49816* (2013.01); *H01L 23/5384* (2013.01); *H01L 23/5389* (2013.01); *H01L 24/17* (2013.01); *H01L 24/19* (2013.01); *H01L 24/20* (2013.01); *H01L 24/32* (2013.01); *H01L 24/49* (2013.01); *H01L 24/73* (2013.01); *H01L 24/92* (2013.01); *H01L 24/96* (2013.01); *H01L 24/97* (2013.01); *H01L 25/105* (2013.01); *H01L 25/50* (2013.01); *H01L 21/0273* (2013.01); *H01L 21/2885* (2013.01); *H01L 21/3212* (2013.01); *H01L 21/565* (2013.01); *H01L 21/7684* (2013.01); *H01L 21/76879* (2013.01); *H01L 21/76898* (2013.01); *H01L 22/14* (2013.01); *H01L 24/13* (2013.01); *H01L 24/16* (2013.01); *H01L 24/48* (2013.01); *H01L 24/81* (2013.01); *H01L 24/83* (2013.01); *H01L 25/0657* (2013.01); *H01L 2221/68327* (2013.01); *H01L 2221/68372* (2013.01); *H01L 2221/68381* (2013.01); *H01L 2224/0237* (2013.01); *H01L 2224/0401* (2013.01); *H01L 2224/04105* (2013.01); *H01L 2224/05124* (2013.01); *H01L 2224/05147* (2013.01); *H01L 2224/11334* (2013.01); *H01L 2224/11462* (2013.01); *H01L 2224/11616* (2013.01); *H01L 2224/11622* (2013.01); *H01L 2224/12105* (2013.01); *H01L 2224/13101* (2013.01); *H01L 2224/13144* (2013.01); *H01L 2224/13147* (2013.01); *H01L 2224/13155* (2013.01); *H01L 2224/16145* (2013.01); *H01L 2224/16146* (2013.01); *H01L 2224/16225* (2013.01); *H01L 2224/19* (2013.01); *H01L 2224/24137* (2013.01); *H01L 2224/32145* (2013.01); *H01L 2224/32225* (2013.01); *H01L 2224/45099* (2013.01); *H01L 2224/48091* (2013.01); *H01L 2224/48096* (2013.01); *H01L 2224/48106* (2013.01); *H01L 2224/48227* (2013.01); *H01L 2224/73204* (2013.01); *H01L 2224/73253* (2013.01); *H01L 2224/73259* (2013.01); *H01L 2224/73265* (2013.01); *H01L 2224/73267* (2013.01); *H01L 2224/81* (2013.01); *H01L 2224/81005* (2013.01); *H01L 2224/81203* (2013.01); *H01L 2224/81895* (2013.01); *H01L 2224/83* (2013.01); *H01L 2224/83005* (2013.01); *H01L 2224/9222* (2013.01); *H01L 2224/92244* (2013.01); *H01L 2224/97* (2013.01); *H01L 2225/0651* (2013.01); *H01L 2225/0652* (2013.01); *H01L 2225/06513* (2013.01); *H01L 2225/06517* (2013.01); *H01L 2225/06541* (2013.01); *H01L 2225/06548* (2013.01); *H01L 2225/06558* (2013.01); *H01L 2225/06565* (2013.01); *H01L 2225/06568* (2013.01); *H01L 2225/06572* (2013.01); *H01L 2225/1035* (2013.01); *H01L 2225/1058* (2013.01); *H01L 2924/00014* (2013.01); *H01L 2924/014* (2013.01); *H01L 2924/01013* (2013.01); *H01L 2924/01014* (2013.01); *H01L 2924/01022* (2013.01); *H01L 2924/01029* (2013.01); *H01L 2924/01074* (2013.01); *H01L 2924/01322* (2013.01); *H01L 2924/10252* (2013.01); *H01L 2924/10253* (2013.01); *H01L 2924/10271* (2013.01); *H01L 2924/12042* (2013.01); *H01L 2924/1436* (2013.01); *H01L 2924/15311* (2013.01); *H01L 2924/181* (2013.01); *H01L 2924/18162* (2013.01)

(58) Field of Classification Search
CPC ............. H01L 25/0657; H01L 25/0652; H01L 25/0655; H01L 25/105; H01L 25/18; H01L 21/50; H01L 21/561; H01L 21/563; H01L 21/568; H01L 23/485; H01L 23/438; H01L 23/4383; H01L 23/5384; H01L 23/5386
See application file for complete search history.

(56) References Cited

U.S. PATENT DOCUMENTS

| | | |
|---|---|---|
| 6,281,046 B1 | 8/2001 | Lam |
| 6,335,565 B1 | 1/2002 | Miyamoto et al. |
| 7,105,920 B2 | 9/2006 | Su et al. |
| 7,545,047 B2 | 6/2009 | Bauer et al. |
| 7,573,136 B2 | 8/2009 | Jiang et al. |
| 7,619,901 B2 | 11/2009 | Eichelberger et al. |
| 7,795,721 B2 | 9/2010 | Kurita |
| 7,838,337 B2 | 11/2010 | Marimuthu et al. |
| 7,969,009 B2 | 6/2011 | Chandrasekaran |
| 8,093,722 B2 | 1/2012 | Chen et al. |
| 8,097,490 B1 | 1/2012 | Pagaila et al. |
| 8,105,875 B1 | 1/2012 | Hu et al. |
| 8,143,097 B2 | 3/2012 | Chi et al. |
| 8,263,439 B2 | 9/2012 | Marimuthu et al. |
| 8,293,580 B2 | 10/2012 | Kim et al. |
| 8,361,842 B2 | 1/2013 | Yu et al. |
| 8,435,835 B2 | 5/2013 | Pagaila et al. |
| 8,476,769 B2 | 7/2013 | Chen et al. |
| 8,503,186 B2 | 8/2013 | Lin et al. |
| 8,508,045 B2 | 8/2013 | Khan et al. |
| 8,604,568 B2 | 12/2013 | Stacey |
| 8,710,657 B2 | 4/2014 | Park et al. |
| 8,736,035 B2 | 5/2014 | Hwang et al. |
| 8,754,514 B2 | 6/2014 | Yu et al. |
| 8,791,016 B2 | 7/2014 | Gambino et al. |
| 8,841,748 B2 | 9/2014 | Joblot et al. |
| 8,872,319 B2 | 10/2014 | Kim et al. |
| 8,928,114 B2 | 1/2015 | Chen et al. |
| 8,957,525 B2 | 2/2015 | Lyne et al. |
| 8,975,726 B2 | 3/2015 | Chen et al. |
| 9,048,306 B2 | 6/2015 | Chi et al. |

(56) References Cited

U.S. PATENT DOCUMENTS

| | | |
|---|---|---|
| 9,087,835 B2 | 7/2015 | Sutardja et al. |
| 9,373,527 B2 | 6/2016 | Yu et al. |
| 9,455,313 B1 | 9/2016 | Christensen et al. |
| 9,768,048 B2* | 9/2017 | Lin .................. H01L 25/105 |
| 2002/0117743 A1 | 8/2002 | Nakatani et al. |
| 2003/0001240 A1 | 1/2003 | Whitehair et al. |
| 2003/0219969 A1 | 11/2003 | Saito et al. |
| 2004/0095734 A1 | 5/2004 | Nair |
| 2004/0187297 A1 | 9/2004 | Su et al. |
| 2004/0256731 A1 | 12/2004 | Mao et al. |
| 2006/0043549 A1 | 3/2006 | Hsu |
| 2006/0063312 A1 | 3/2006 | Kurita |
| 2006/0133056 A1 | 6/2006 | Wyrzykowska et al. |
| 2007/0161266 A1 | 7/2007 | Nishizawa |
| 2008/0006936 A1 | 1/2008 | Hsu |
| 2008/0142976 A1 | 6/2008 | Kawano |
| 2008/0220563 A1 | 9/2008 | Kamezos |
| 2008/0277800 A1 | 11/2008 | Hwang et al. |
| 2009/0057862 A1 | 3/2009 | Ha et al. |
| 2009/0155957 A1 | 6/2009 | Chen et al. |
| 2009/0230535 A1 | 9/2009 | Otremba et al. |
| 2010/0112756 A1 | 5/2010 | Amrine et al. |
| 2010/0127345 A1 | 5/2010 | Sanders et al. |
| 2010/0133704 A1 | 6/2010 | Marimuthu et al. |
| 2010/0140779 A1* | 6/2010 | Lin .................. H01L 23/49816 257/690 |
| 2010/0155126 A1 | 6/2010 | Kunimoto et al. |
| 2010/0155922 A1 | 6/2010 | Pagaila et al. |
| 2010/0230823 A1 | 9/2010 | Ihara |
| 2010/0237482 A1 | 9/2010 | Yang et al. |
| 2010/0243299 A1 | 9/2010 | Kariya et al. |
| 2011/0024902 A1 | 2/2011 | Lin et al. |
| 2011/0024916 A1* | 2/2011 | Marimuthu .......... H01L 21/565 257/774 |
| 2011/0037157 A1 | 2/2011 | Shin et al. |
| 2011/0062592 A1 | 3/2011 | Lee et al. |
| 2011/0090570 A1 | 4/2011 | DeCusatis et al. |
| 2011/0156247 A1 | 6/2011 | Chen et al. |
| 2011/0163391 A1 | 7/2011 | Kinzer et al. |
| 2011/0163457 A1 | 7/2011 | Mohan et al. |
| 2011/0186960 A1 | 8/2011 | Wu et al. |
| 2011/0186977 A1 | 8/2011 | Chi et al. |
| 2011/0193221 A1 | 8/2011 | Hu et al. |
| 2011/0204509 A1 | 8/2011 | Lin et al. |
| 2011/0215464 A1 | 9/2011 | Guzek et al. |
| 2011/0241218 A1 | 10/2011 | Meyer et al. |
| 2011/0260336 A1 | 10/2011 | Kang et al. |
| 2011/0278736 A1 | 11/2011 | Lin et al. |
| 2011/0285005 A1 | 11/2011 | Lin et al. |
| 2012/0032340 A1 | 2/2012 | Choi et al. |
| 2012/0038053 A1 | 2/2012 | Oh et al. |
| 2012/0049346 A1 | 3/2012 | Lin et al. |
| 2012/0056312 A1 | 3/2012 | Pagaila et al. |
| 2012/0139068 A1 | 6/2012 | Stacey |
| 2012/0161315 A1 | 6/2012 | Lin |
| 2012/0208319 A1 | 8/2012 | Meyer et al. |
| 2012/0217643 A1 | 8/2012 | Pagaila et al. |
| 2012/0273960 A1 | 11/2012 | Park et al. |
| 2012/0319294 A1 | 12/2012 | Lee et al. |
| 2012/0319295 A1 | 12/2012 | Chi et al. |
| 2013/0009322 A1 | 1/2013 | Conn et al. |
| 2013/0009325 A1 | 1/2013 | Mori et al. |
| 2013/0062760 A1 | 3/2013 | Hung et al. |
| 2013/0062761 A1 | 3/2013 | Lin et al. |
| 2013/0093078 A1 | 4/2013 | Lin et al. |
| 2013/0105991 A1 | 5/2013 | Gan et al. |
| 2013/0111123 A1 | 5/2013 | Thayer |
| 2013/0181325 A1 | 7/2013 | Chen et al. |
| 2013/0182402 A1 | 7/2013 | Chen et al. |
| 2013/0234322 A1 | 9/2013 | Pendse |
| 2013/0256836 A1 | 10/2013 | Hsiao et al. |
| 2013/0307155 A1 | 11/2013 | Mitsuhashi |
| 2013/0334697 A1 | 12/2013 | Shin et al. |
| 2014/0070422 A1 | 3/2014 | Hsiao et al. |
| 2014/0091473 A1 | 4/2014 | Len et al. |
| 2014/0103488 A1 | 4/2014 | Chen et al. |
| 2014/0110856 A1 | 4/2014 | Lin |
| 2014/0183731 A1 | 7/2014 | Lin et al. |
| 2014/0264836 A1 | 9/2014 | Chun et al. |
| 2014/0367828 A1 | 12/2014 | Colonna et al. |
| 2015/0093881 A1 | 4/2015 | Chen et al. |
| 2015/0096798 A1 | 4/2015 | Uzoh |
| 2015/0102464 A1 | 4/2015 | Kang et al. |
| 2015/0115464 A1 | 4/2015 | Yu et al. |
| 2015/0115470 A1 | 4/2015 | Su et al. |
| 2015/0155203 A1 | 6/2015 | Chen et al. |
| 2016/0148991 A1 | 5/2016 | Erickson et al. |
| 2016/0293577 A1 | 10/2016 | Yu et al. |
| 2016/0322330 A1 | 11/2016 | Lin et al. |

FOREIGN PATENT DOCUMENTS

| | | |
|---|---|---|
| CN | 102157391 A | 8/2011 |
| KR | 20110025699 A | 3/2011 |
| KR | 101099578 B1 | 12/2011 |
| KR | 20120060486 A | 6/2012 |
| KR | 1020120075855 A | 7/2012 |
| KR | 1020120094182 A | 8/2012 |
| KR | 1020120098844 A | 9/2012 |
| TW | 200919632 | 5/2009 |
| TW | 201230266 A | 7/2012 |
| WO | 2011090570 | 7/2011 |

OTHER PUBLICATIONS

Zhang, Y. et al., "Lead-Free Bumping and Its Challenges," IWPLC Conference Proceedings, Oct. 10, 2004, 8 pages.

* cited by examiner

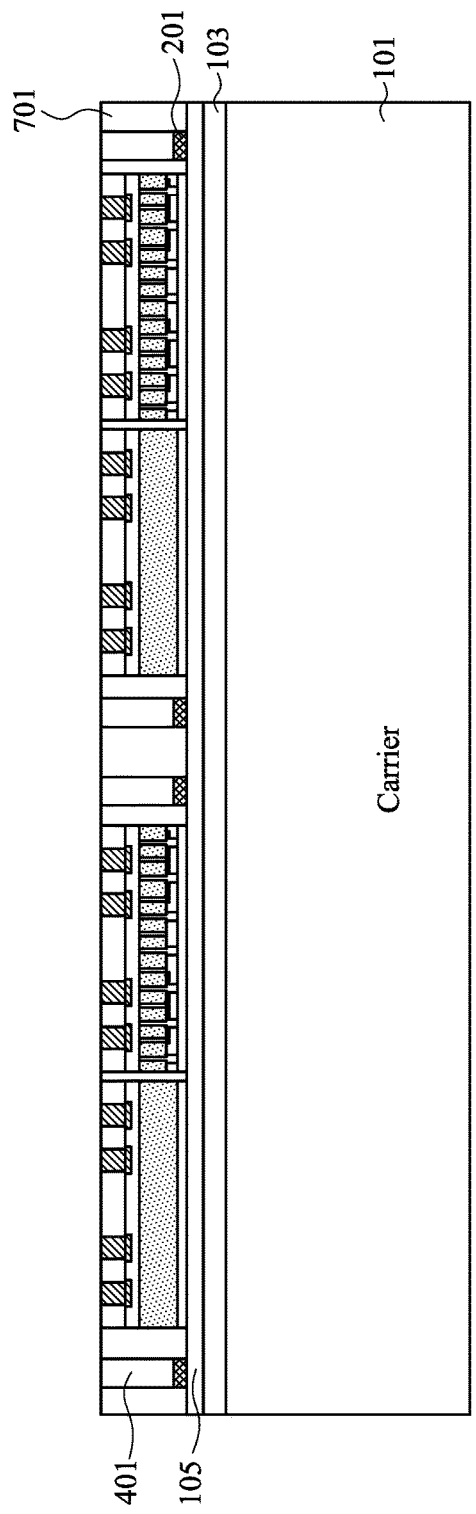

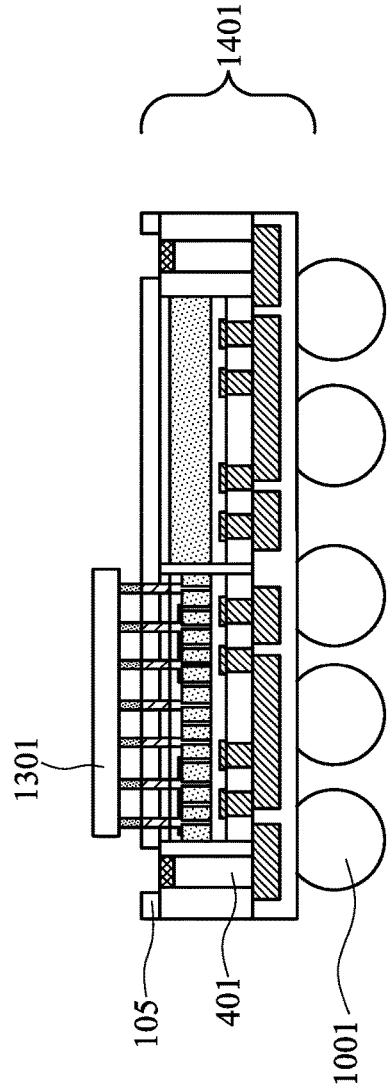
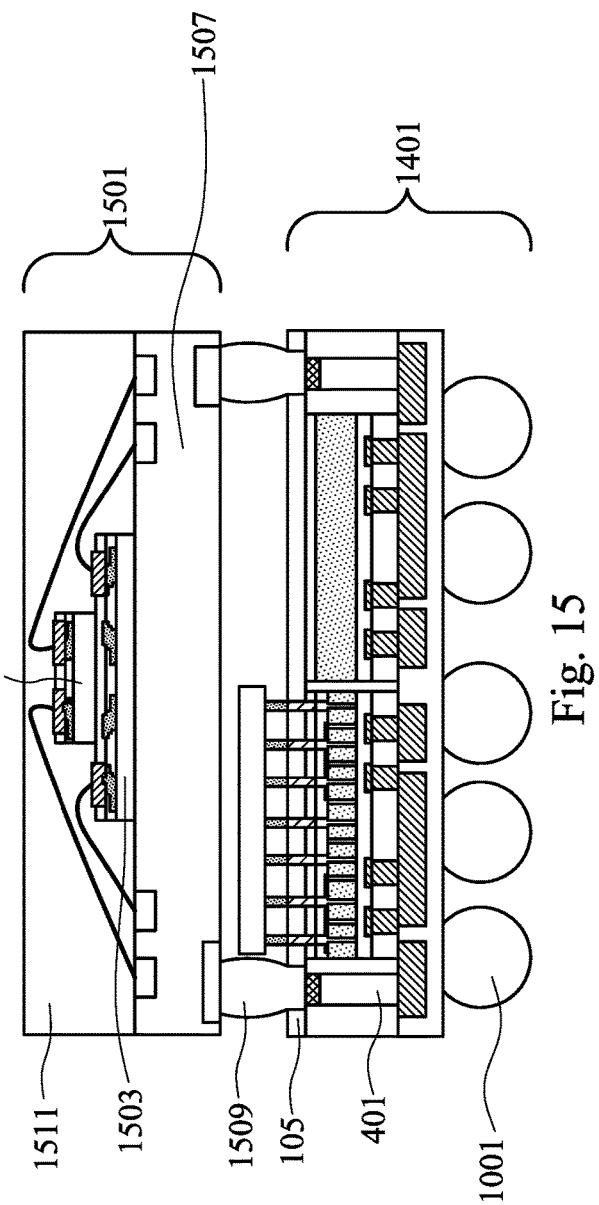
Fig. 14
Fig. 15

US 10,964,666 B2

CHIP ON PACKAGE STRUCTURE AND METHOD

This application is a continuation of U.S. patent application Ser. No. 15/186,624, entitled "Chip on Package Structure and Method," filed on Jun. 20, 2016, which is a continuation of U.S. patent application Ser. No. 14/147,316, entitled "Chip on Package Structure and Method," filed on Jan. 3, 2014, now U.S. Pat. No. 9,373,527 issued on Jun. 21, 2016, which claims the benefit of U.S. Provisional Application No. 61/897,695, entitled "InFO-Chip on Package Structure and Method," filed on Oct. 30, 2013, which applications are incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1-15 describe a method and structure of packaging semiconductor devices in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device within an Chip on Package (CoP) structure. The invention may also be applied, however, to other packages.

Figure 1:
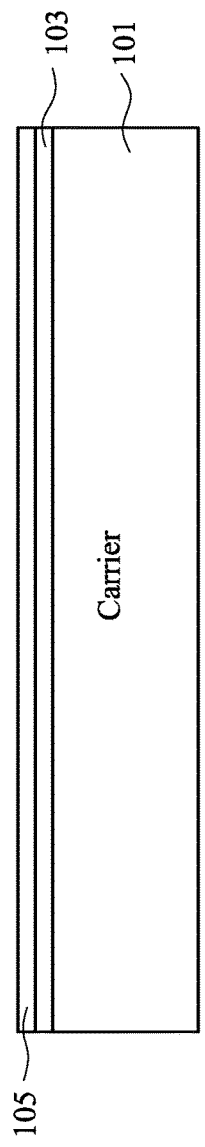

With reference now to FIG. 1, there is shown a carrier substrate 101 with an adhesive layer 103 and a polymer layer 105 over the adhesive layer 103. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of semiconductor devices such as a first semiconductor device 601 and a second semiconductor device 603 (not illustrated in FIG. 1 but illustrated and discussed below with respect to FIG. 6).

The adhesive layer 103 is placed on the carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the carrier substrate 101 in a semi-liquid or gel form, which is readily deformable under pressure.

The polymer layer 105 is placed over the adhesive layer 103 and is utilized in order to provide protection to, e.g., the first semiconductor device 601 and the second semiconductor device 603 once the first semiconductor device 601 and the second semiconductor device 603 have been attached. In an embodiment the polymer layer 105 may be polybenzoxazole (PBO), although any suitable material, such as polyimide or a polyimide derivative, may alternatively be utilized. The polymer layer 105 may be placed using, e.g., a spin-coating process to a thickness of between about 2 µm and about 15 µm, such as about 5 µm, although any suitable method and thickness may alternatively be used.

Figure 2:
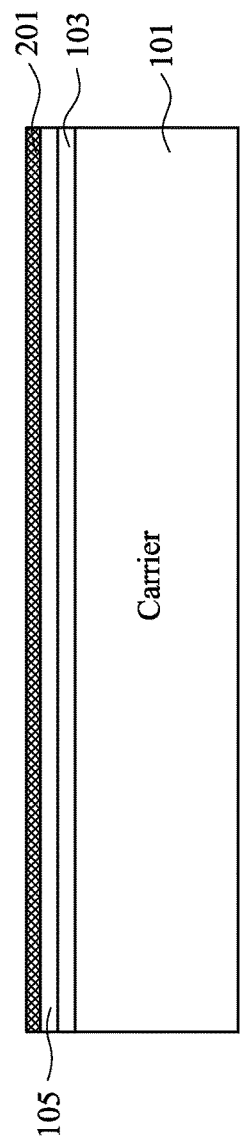

FIG. 2 illustrates the placement of a seed layer 201 over the polymer layer 105. The seed layer 201 is a thin layer of a conductive material that aids in the formation of a thicker layer during subsequent processing steps. The seed layer 201 may comprise a layer of titanium about 1,000 Å thick followed by a layer of copper about 5,000 Å thick. The seed layer 201 may be created using processes such as sputtering, evaporation, or PECVD processes, depending upon the desired materials. The seed layer 201 may be formed to have a thickness of between about 0.3 µm and about 1 µm, such as about 0.5 µm.

Figure 3:
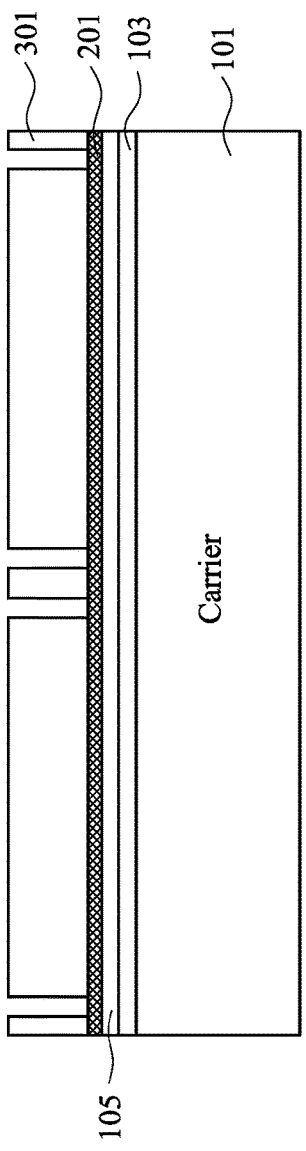

FIG. 3 illustrates a placement and patterning of a photoresist 301 over the seed layer 201. In an embodiment the photoresist 301 may be placed on the seed layer 201 using, e.g., a spin coating technique to a height of between about 50 µm and about 250 µm, such as about 120 µm. Once in place, the photoresist 301 may then be patterned by exposing the photoresist 301 to a patterned energy source (e.g., a patterned light source) so as to induce a chemical reaction, thereby inducing a physical change in those portions of the photoresist 301 exposed to the patterned light source. A developer is then applied to the exposed photoresist 301 to take advantage of the physical changes and selectively remove either the exposed portion of the photoresist 301 or the unexposed portion of the photoresist 301, depending upon the desired pattern.

In an embodiment the pattern formed into the photoresist 301 is a pattern for vias 401 (not illustrated in FIG. 3 but illustrated and discussed below with respect to FIG. 4). The vias 401 are formed in such a placement as to be located on different sides of subsequently attached devices such as the first semiconductor device 601 and the second semiconductor device 603. However, any suitable arrangement for the pattern of vias 401, such as by being located such that the first semiconductor device 601 and the second semiconductor device are placed on opposing sides of the vias 401, may alternatively be utilized.

Figure 4:
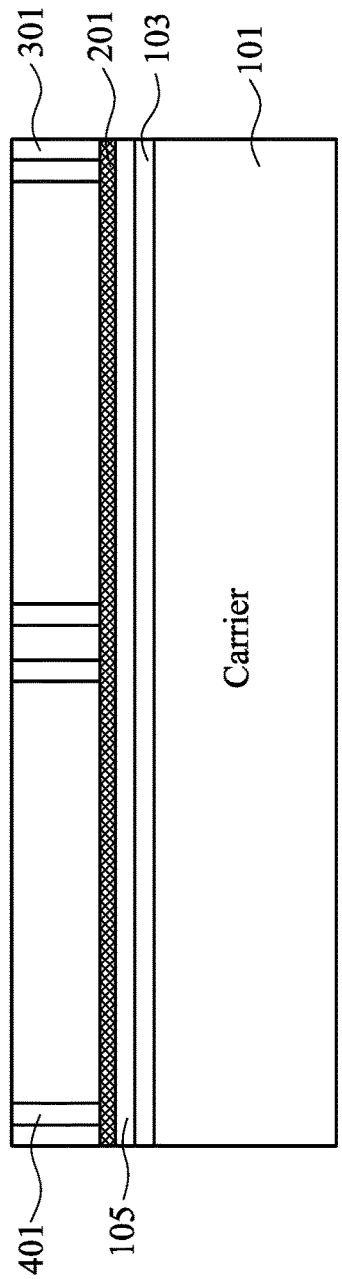

FIG. 4 illustrates a formation of the vias 401 within the photoresist 301. In an embodiment the vias 401 comprise one or more conductive materials, such as copper, tungsten, other conductive metals, or the like, and may be formed, for example, by electroplating, electroless plating, or the like. In an embodiment, an electroplating process is used wherein the seed layer 201 and the photoresist 301 are submerged or immersed in an electroplating solution. The seed layer 201 surface is electrically connected to the negative side of an external DC power supply such that the seed layer 201 functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer 201, acquires the dissolved atoms, thereby plating the exposed conductive areas of the seed layer 201 within the opening of the photoresist 301.

Figure 5:
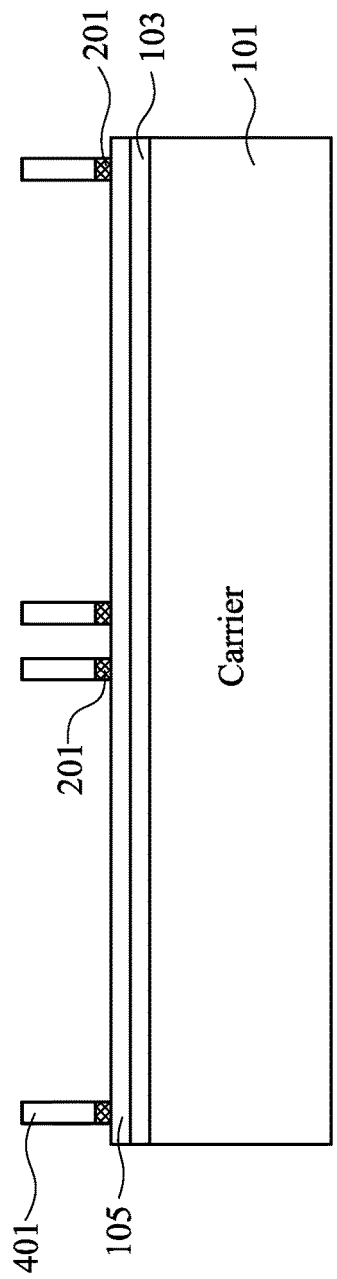

FIG. 5 illustrates that, once the vias 401 have been formed using the photoresist 301 and the seed layer 201, the photoresist 301 may be removed using a suitable removal process. In an embodiment, a plasma ashing process may be used to remove the photoresist 301, whereby the temperature of the photoresist 301 may be increased until the photoresist 301 experiences a thermal decomposition and may be removed. However, any other suitable process, such as a wet strip, may alternatively be utilized. The removal of the photoresist 301 may expose the underlying portions of the seed layer 201.

FIG. 5 additionally illustrates a removal of exposed portions of the seed layer 201. In an embodiment the exposed portions of the seed layer 201 (e.g., those portions that are not covered by the vias 401) may be removed by, for example, a wet or dry etching process. For example, in a dry etching process reactants may be directed towards the seed layer 201, using the vias 401 as masks. Alternatively, etchants may be sprayed or otherwise put into contact with the seed layer 201 in order to remove the exposed portions of the seed layer 201. After the exposed portion of the seed layer 201 has been etched away, a portion of the polymer layer 105 is exposed between the vias 401.

Figure 6:
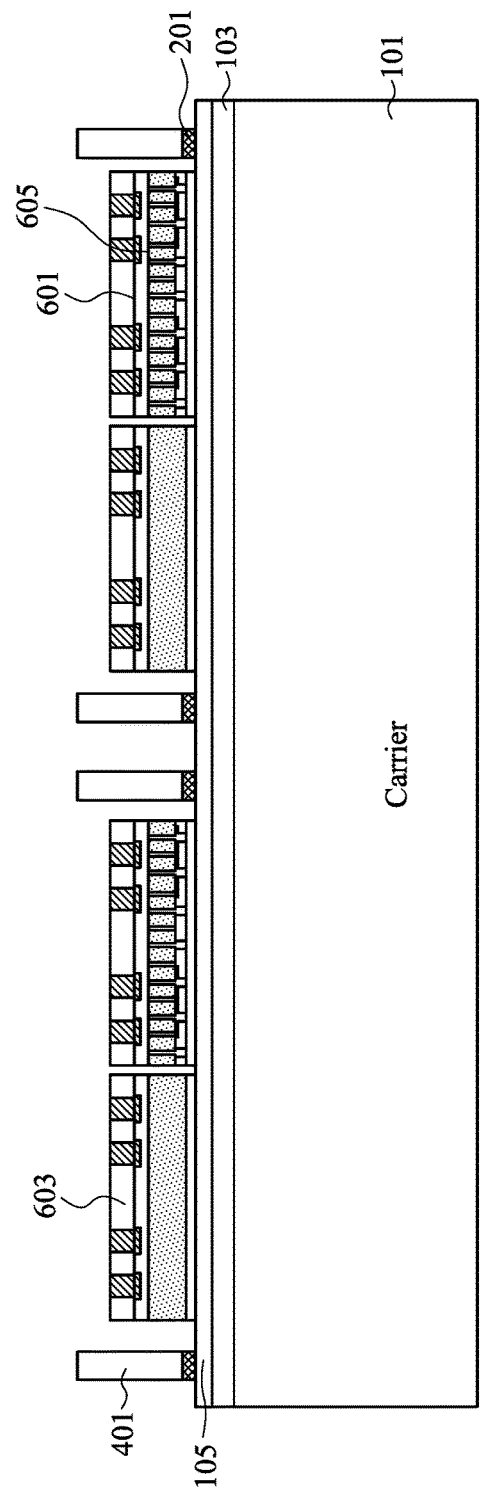

FIG. 6 illustrates a placement of the first semiconductor device 601 and the second semiconductor device 603 onto the polymer layer 105 and within or between the vias 401. In an embodiment the first semiconductor device 601 and the second semiconductor device 603 are electrically connected through, e.g., a redistribution layer (RDL) 901 (not illustrated in FIG. 6 but illustrated and discussed below with respect to FIG. 9) and may be utilized together in order to provide a desired functionality to an end user. In an embodiment the first semiconductor device 601 and the second semiconductor device 603 may be attached to the polymer 105 using, e.g., an adhesive material, although any suitable method of attachment may alternatively be utilized.

In a particular embodiment, the second semiconductor device 603 may be formed with a more advanced technology node than the first semiconductor device 601. By utilizing different technology nodes, the smaller sizes and faster capabilities of the more advanced technology node may be used in the second semiconductor device 603 while also not requiring the use of the more expensive manufacturing processes in each component. For example, in one embodiment the second semiconductor device 603 may be manufactured using a 16 nm technology node while the first semiconductor device 601 may be manufactured with a 28 nm technology node. However, any suitable combination of technology nodes, also including using the same technology node for both the first semiconductor device 601 and the second semiconductor device 603, may alternatively be utilized.

By using a more advanced technology node, the second semiconductor device 603 may operate at a higher speed and with more processing power than the first semiconductor device 601. In a particular embodiment the second semiconductor device 603 may have an operating speed of greater than or equal to about 3 GHz. Additionally, the second semiconductor device 603 may have a bus size greater than or equal to about 32 bits.

Additionally, other differences between the first semiconductor device 601 and the second semiconductor device 603 may be utilized to efficiently leverage the benefits of each device (e.g., speed, cost, size, etc.). In another embodiment the second semiconductor device 603 may be, e.g., a digital logic device used to perform logic functions. However, the first semiconductor device 601 may be partitioned into two regions (not individually illustrated in FIG. 6) such as a digital region and an analog region. By using such a hybrid configuration, the first semiconductor device 601 and the second semiconductor device 603 may be modified to provide the best structure for the desired functionality.

The second semiconductor device 603 may comprise a first substrate, first active devices, first metallization layers, first contact pads, first passivation layers, and first external connectors. The first substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the second semiconductor device 603. The first active devices may be formed using any suitable methods either within or else on the first substrate.

The first metallization layers are formed over the first substrate and the first active devices and are designed to connect the various active devices to form functional circuitry. In an embodiment the first metallization layers are formed of alternating layers of dielectric and conductive material and may be formed through any suitable process (such as deposition, damascene, dual damascene, etc.). In an embodiment there may be four layers of metallization separated from the first substrate by at least one interlayer dielectric layer (ILD), but the precise number of first metallization layers is dependent upon the design of the second semiconductor device 603.

The first contact pads may be formed over and in electrical contact with the first metallization layers. The first contact pads may comprise aluminum, but other materials, such as copper, may alternatively be used. The first contact pads may be formed using a deposition process, such as sputtering, to form a layer of material (not shown) and portions of the layer of material may then be removed through a suitable process (such as photolithographic masking and etching) to form the first contact pads. However, any other suitable process may be utilized to form the first contact pads. The first contact pads may be formed to have a thickness of between about 0.5 µm and about 4 µm, such as about 1.45 µm.

The first passivation layers may be formed on the first substrate over the first metallization layers and the first contact pads. The first passivation layers may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layers may be formed through a process such as chemical vapor deposition (CVD), although any suitable process may be utilized, and may have a thickness between about 0.5 µm and about 5 µm, such as about 9.25 KÅ.

The first external connectors may be formed to provide conductive regions for contact between the first contact pads and, e.g., a redistribution layer 901 (not illustrated in FIG. 6 but illustrated and described below with respect to FIG. 9). In an embodiment the first external connectors may be conductive pillars and may be formed by initially forming a photoresist (not shown) over the first passivation layers to a thickness between about 5 µm to about 20 µm, such as about 10 µm. The photoresist may be patterned to expose portions of the first passivation layers through which the conductive pillars will extend. Once patterned, the photoresist may then be used as a mask to remove the desired portions of the first passivation layers, thereby exposing those portions of the underlying first contact pads to which the conductive pillars will make contact.

The conductive pillars may be formed within the openings of both the first passivation layers and the photoresist. The conductive pillars may be formed from a conductive material such as copper, although other conductive materials such as nickel, gold, or metal alloy, combinations of these, or the like may also be used. Additionally, the conductive pillars may be formed using a process such as electroplating, by which an electric current is run through the conductive portions of the first contact pads to which the conductive pillars are desired to be formed, and the first contact pads are immersed in a solution. The solution and the electric current deposit, e.g., copper, within the openings in order to fill and/or overfill the openings of the photoresist and the first passivation layers, thereby forming the conductive pillars. Excess conductive material and photoresist outside of the openings of the first passivation layer may then be removed using, for example, an ashing process, a chemical mechanical polish (CMP) process, combinations of these, or the like.

However, as one of ordinary skill in the art will recognize, the above described process to form the conductive pillars is merely one such description, and is not meant to limit the embodiments to this exact process. Rather, the described process is intended to be merely illustrative, as any suitable process for forming the first external connectors may alternatively be utilized. All suitable processes are fully intended to be included within the scope of the present embodiments.

In an embodiment the first semiconductor device 601 comprises a second substrate, second active devices, second metallization layers, second contact pads, second passivation layers, and second external connectors. Each of these elements may be similar to the first substrate, first active devices, first metallization layers, first contact pads, first passivation layers, and first external connectors as described above with respect to the second semiconductor device 603, although they may alternatively be different if desired.

In addition to these elements that may be similar, the first semiconductor device 601 additionally includes a plurality of through silicon vias (TSVs) 605 that extend through the substrate of the first semiconductor device 601 so as to provide a quick passage of data signals from a third semiconductor device 1301 (not illustrated in FIG. 6 but illustrated and discussed below with respect to FIG. 13) to the second semiconductor device 603. In an embodiment, the first semiconductor device 605 may have, e.g., greater than about 1200 TSVs, although any suitable number may alternatively be utilized.

In an embodiment the through silicon vias may be formed by initially forming through silicon via (TSV) openings into the second substrate. The TSV openings may be formed by applying and developing a suitable photoresist (not shown), and removing portions of the second substrate that are exposed to the desired depth. The TSV openings may be formed so as to extend into the second substrate at least further than the second active devices formed within and/or on the second substrate, and may extend to a depth greater than the eventual desired height of the second substrate. Accordingly, while the depth is dependent upon the overall designs, the depth may be between about 20 µm and about 200 µm from the second active devices on the second substrate, such as a depth of about 50 µm from the second active devices on the second substrate.

Once the TSV openings have been formed within the second substrate, the TSV openings may be lined with a liner. The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Additionally, the liner may be formed to a thickness of between about 0.1 µm and about 5 µm, such as about 1 µm.

Once the liner has been formed along the sidewalls and bottom of the TSV openings, a barrier layer (also not independently illustrated) may be formed and the remainder of the TSV openings may be filled with first conductive material. The first conductive material may comprise copper, although other suitable materials such as aluminum, alloys, doped polysilicon, combinations thereof, and the like, may alternatively be utilized. The first conductive material may be formed by electroplating copper onto a seed layer (not shown), filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used.

Once the TSV openings have been filled, a backside of the second substrate may be thinned to expose the TSV openings and form the TSVs 605. In an embodiment the second substrate may be thinned using, e.g., a CMP and grinding process to remove the material of the second substrate as well as planarize the second substrate and the TSVs 605 once the TSVs 605 have been exposed. Alterntively, one or more etching processes or other removal processes may also be used to remove material of the second substrate and to expose the TSVs 605.

Once exposed, third contact pads may be formed in connection with the now exposed TSVs 605. In an embodiment the third contact pads may comprise aluminum, but other materials, such as copper, may alternatively be used. The third contact pads may be formed using a deposition process, such as sputtering, to form a layer of material (not shown) and portions of the layer of material may then be removed through a suitable process (such as photolithographic masking and etching) to form the third contact pads. However, any other suitable process may be utilized to form the third contact pads. The third contact pads may be formed to have a thickness of between about 0.5 µm and about 7 µm, such as about 45 µm.

Figure 7:
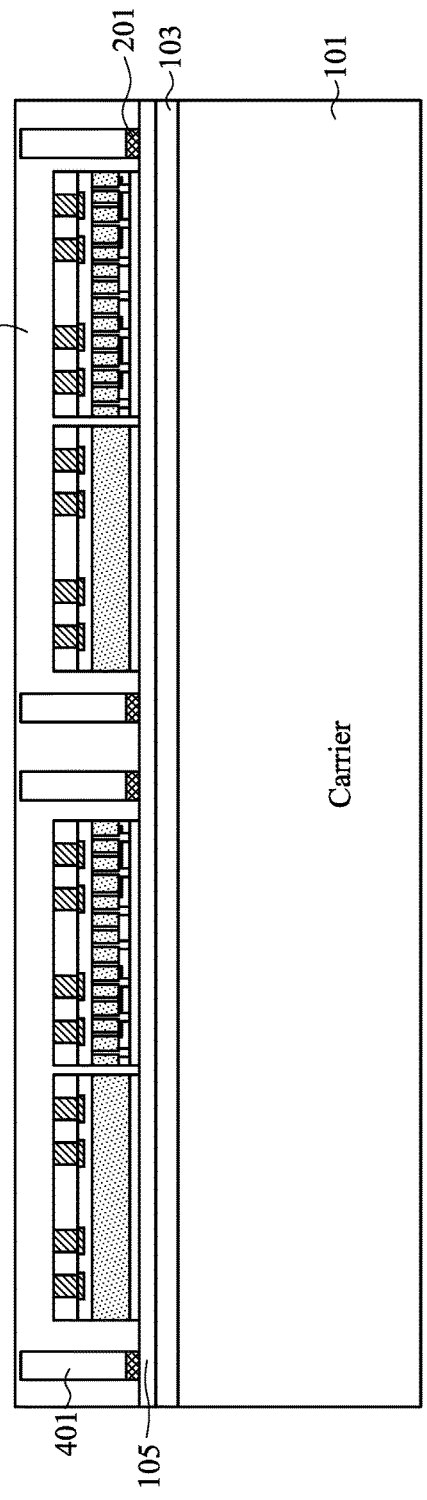

FIG. 7 illustrates an encapsulation of the first semiconductor device 601, the second semiconductor device 603, and the vias 401. The encapsulation may be performed in a molding device (not individually illustrated in FIG. 7), which may comprise a top molding portion and a bottom molding portion separable from the top molding portion. When the top molding portion is lowered to be adjacent to the bottom molding portion, a molding cavity may be formed for the carrier substrate 101, the vias 401, the first semiconductor device 601, and the second semiconductor device 603.

During the encapsulation process the top molding portion may be placed adjacent to the bottom molding portion, thereby enclosing the carrier substrate 101, the vias 401, the first semiconductor device 601, and the second semiconductor device 603 within the molding cavity. Once enclosed, the top molding portion and the bottom molding portion may form an airtight seal in order to control the influx and outflux of gasses from the molding cavity. Once sealed, an encapsulant 701 may be placed within the molding cavity. The encapsulant 701 may be a molding compound resin such as polyimide, PPS, PEEK, PES, a heat resistant crystal resin, combinations of these, or the like. The encapsulant 701 may be placed within the molding cavity prior to the alignment of the top molding portion and the bottom molding portion, or else may be injected into the molding cavity through an injection port.

Once the encapsulant 701 has been placed into the molding cavity such that the encapsulant 701 encapsulates the carrier substrate 101, the vias 401, the first semiconductor device 601, and the second semiconductor device 603, the encapsulant 701 may be cured in order to harden the encapsulant 701 for optimum protection. While the exact curing process is dependent at least in part on the particular material chosen for the encapsulant 701, in an embodiment in which molding compound is chosen as the encapsulant 701, the curing could occur through a process such as heating the encapsulant 701 to between about 100° C. and about 130° C., such as about 125° C. for about 60 sec to about 3000 sec, such as about 600 sec. Additionally, initiators and/or catalysts may be included within the encapsulant 701 to better control the curing process.

However, as one having ordinary skill in the art will recognize, the curing process described above is merely an exemplary process and is not meant to limit the current embodiments. Other curing processes, such as irradiation or even allowing the encapsulant 701 to harden at ambient temperature, may alternatively be used. Any suitable curing process may be used, and all such processes are fully intended to be included within the scope of the embodiments discussed herein.

FIG. 8 illustrates a thinning of the encapsulant 701 in order to expose the vias 401, the first semiconductor device 601, and the second semiconductor device 603 for further processing. The thinning may be performed, e.g., using a mechanical grinding or CMP process whereby chemical etchants and abrasives are utilized to react and grind away the encapsulant 701, the first semiconductor device 601 and the second semiconductor device 603 until the vias 401, the first contact pads (on the first semiconductor device 601), and the second contact pads (on the second semiconductor device 603) have been exposed. As such, the first semiconductor device 601, the second semiconductor device 603, and the vias 401 may have a planar surface that is also planar with the encapsulant 701.

However, while the CMP process described above is presented as one illustrative embodiment, it is not intended to be limiting to the embodiments. Any other suitable removal process may alternatively be used to thin the encapsulant 701, the first semiconductor device 601, and the second semiconductor device 603 and expose the vias 401. For example, a series of chemical etches may alternatively be utilized. This process and any other suitable process may alternatively be utilized to thin the encapsulant 701, the first semiconductor device 601, and the second semiconductor device 603, and all such processes are fully intended to be included within the scope of the embodiments.

FIG. 9 illustrates a formation of a redistribution layer (RDL) 901 in order to interconnect the first semiconductor device 601, the second semiconductor device 603, the vias 401 and third external connectors 1001 (not illustrated in FIG. 9 but illustrated and described below with respect to FIG. 10). By using the RDL 901 to interconnect the first semiconductor device 601 and the second semiconductor device 603, the first semiconductor device 601 and the second semiconductor device 603 may have a pin count of greater than 1000.

In an embodiment the RDL 901 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the RDL 901 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm, and a width along the first substrate 102 of between about 5 µm and about 300 µm, such as about 5 µm. However, while the material and methods discussed are suitable to form the conductive material, these materials are merely exemplary. Any other suitable materials, such as AlCu or Au, and any other suitable processes of formation, such as CVD or PVD, may alternatively be used to form the RDL 901.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 9 also illustrates a formation of a third passivation layer 903 over the RDL 901 in order to provide protection and isolation for the RDL 901 and the other underlying structures. In an embodiment the third passivation layer 903 may be polybenzoxazole (PBO), although any suitable material, such as polyimide or a polyimide derivative, may alternatively be utilized. The third passivation layer 903 may be placed using, e.g., a spin-coating process to a thickness of between about 5 µm and about 25 µm, such as about 7 µm, although any suitable method and thickness may alternatively be used.

In an embodiment the thickness of the structure from the third passivation layer 903 to the polymer layer 105 may be less than or equal to about 200 µm. By making this thickness as small as possible, the overall structure may be utilized in varying small size applications, such as cell phones and the like, while still maintaining the desired functionality. However, as one of ordinary skill in the art will recognize, the precise thickness of the structure may be dependent at least in part upon the overall design for the unit and, as such, any suitable thickness may alternatively be utilized.

Figure 10:
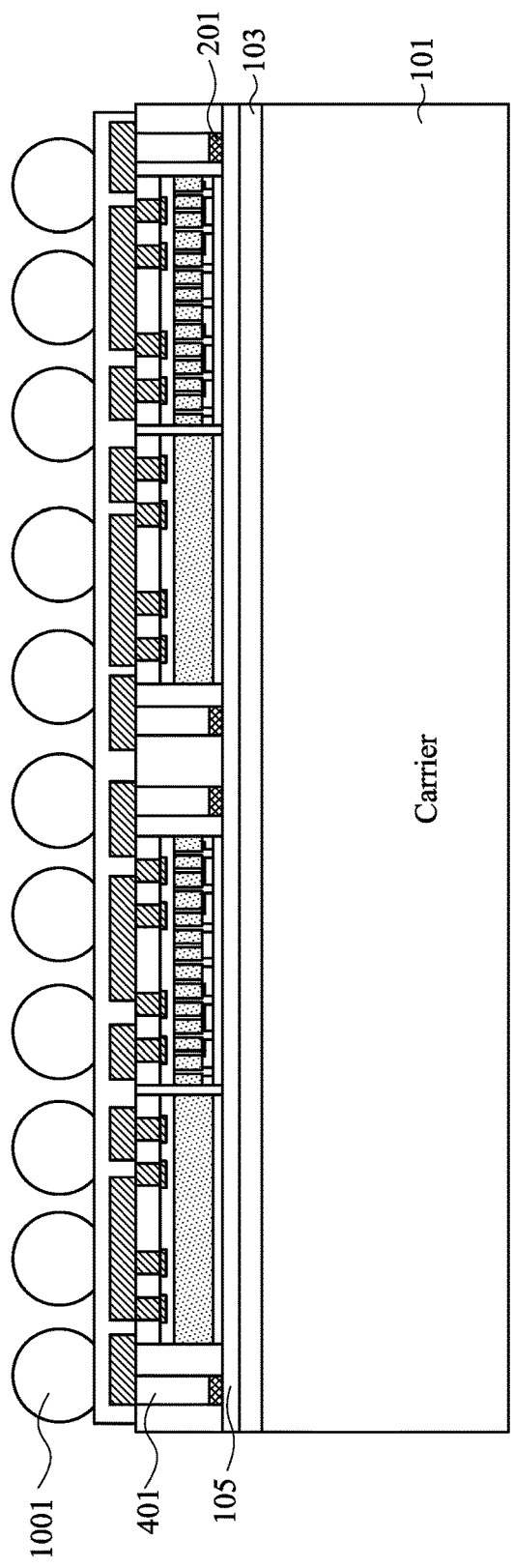

FIG. 10 illustrates a formation of the third external connectors 1001 to make electrical contact with the RDL 901. In an embodiment after the third passivation layer 903 has been formed, an opening may be made through the third passivation layer 903 by removing portions of the third passivation layer 903 to expose at least a portion of the underlying RDL 901. The opening allows for contact between the RDL 901 and the third external connectors 1001. The opening may be formed using a suitable photolithographic mask and etching process, although any suitable process to expose portions of the RDL 901 may be used.

In an embodiment the third external connectors 1001 may be placed on the RDL 901 through the third passivation layer 903 and may comprise a eutectic material such as solder, although any suitable materials may alternatively be used. In an embodiment in which the third external connectors 1001 are solder balls, the third external connectors 1001 may be formed using a ball drop method, such as a direct ball drop process. Alternatively, the solder balls may be formed by initially forming a layer of tin through any suitable method such as evaporation, electroplating, printing, solder transfer, and then performing a reflow is preferably performed in order to shape the material into the desired bump shape.

At this stage, a circuit probe test may be performed in order to check for defective or packages. In an embodiment of the circuit probe test one or more probes (not individually illustrated) are electrically connected to the third external connectors 1001 and signals are sent into the third external connectors 1001 and into, e.g., the first semiconductor device 601 and the second semiconductor device 603. If there are no significant defects, the probes will receive a predetermined output from the third external connectors 1001, and defective structures can be identified. Once identified, defective structures can be removed prior to further processing in order to make the overall process more efficient.

Figure 11:
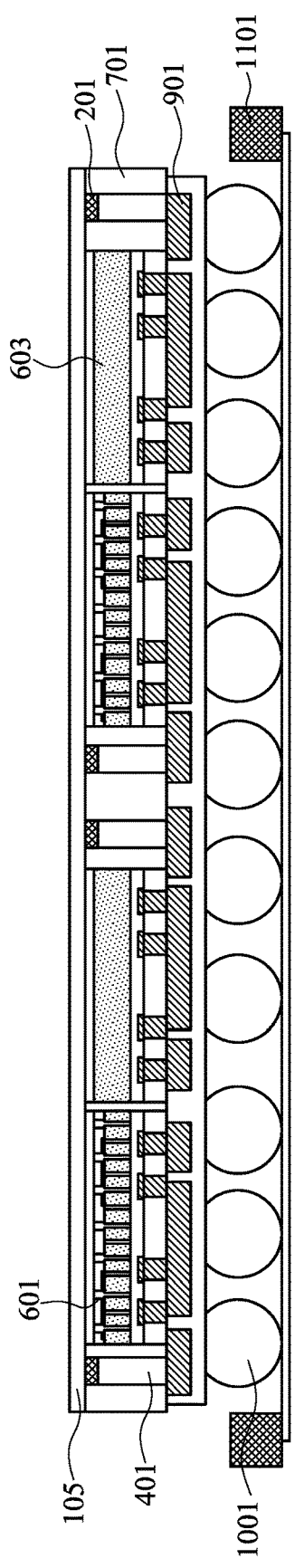

FIG. 11 illustrates a debonding of the carrier substrate 101 from the first semiconductor device 601 and the second semiconductor device 603. In an embodiment the third external connectors 1001 and, hence, the structure including the first semiconductor device 601 and the second semiconductor device 603, may be attached to a ring structure 1101. The ring structure 1101 may be a metal ring intended to provide support and stability for the structure during and after the debonding process. In an embodiment the third external connectors 1001, the first semiconductor device 601, and the second semiconductor device 603 are attached to the ring structure using, e.g., a ultraviolet tape, although any other suitable adhesive or attachment may alternatively be used.

Once the third external connectors 1001 and, hence, the structure including the first semiconductor device 601 and the second semiconductor device 603 are attached to the ring structure 1101, the carrier substrate 101 may be debonded from the structure including the first semiconductor device 601 and the second semiconductor device 603 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the carrier substrate 101 and the adhesive layer 103 may be physically separated and removed from the structure comprising the third external connectors 1001, the first semiconductor device 601, and the second semiconductor device 603.

Figure 12:
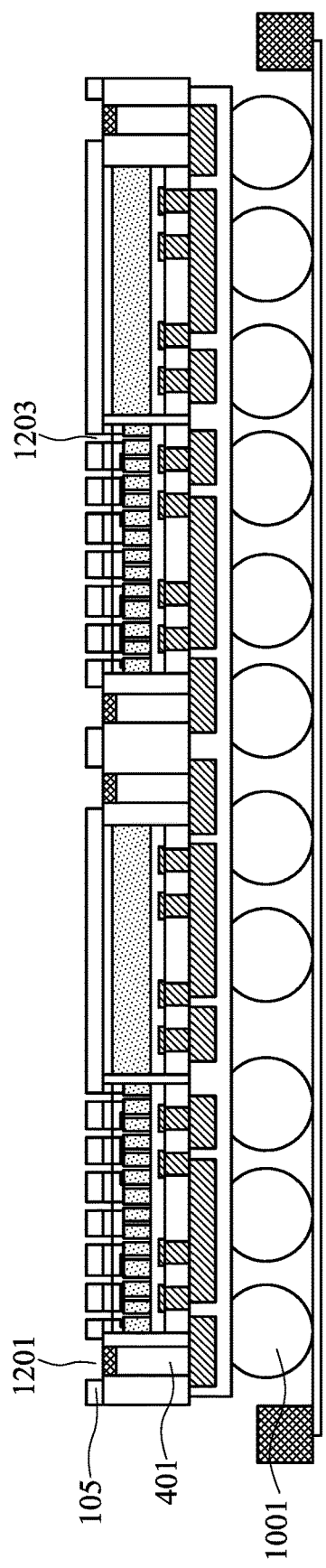

FIG. 12 illustrates that, once the carrier substrate 101 and the adhesive layer 103 have been removed to expose the polymer layer 105, the polymer layer 105 may be patterned in order to expose the vias 401 and also the TSVs 605 within the first semiconductor device 601. In an embodiment the polymer layer 105 may be patterned using, e.g., a laser drilling method, by which a laser is directed towards those portions of the polymer layer 105 which are desired to be removed in order to expose the underlying RDL 901 or vias 401. In an embodiment the patterning may be formed to form first openings 1201 over the vias 401 to have a first width of between about 100 µm and about 300 µm, such as about 200 µm, and also to form second openings 1203 over the first semiconductor device 601 to have a second width of between about 15 µm and about 30 µm, such as about 20 µm.

Alternatively, the polymer layer 105 may be patterned by initially applying a photoresist (not individually illustrated in FIG. 12) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may alternatively be utilized.

Figure 13:
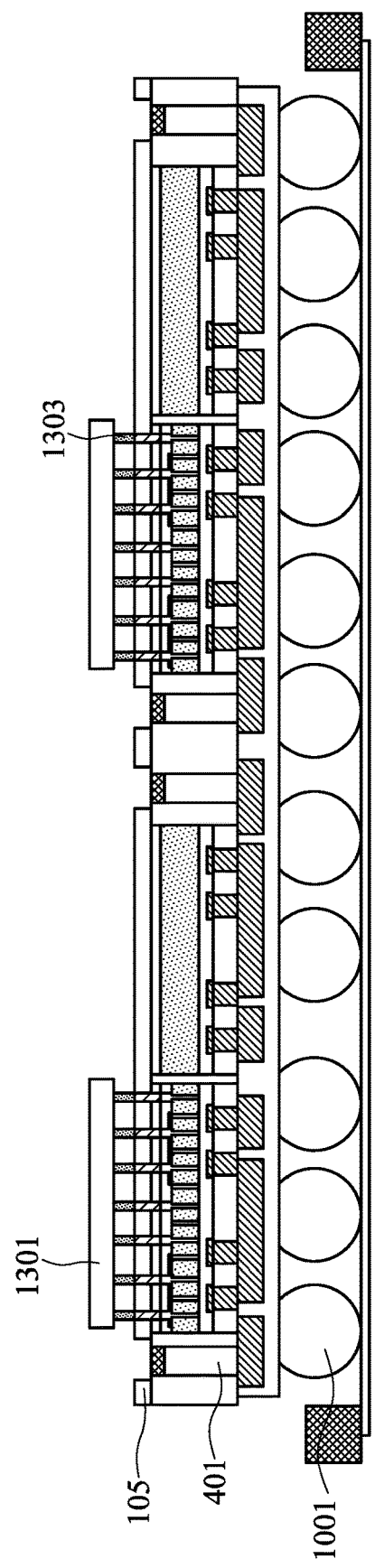

FIG. 13 illustrates a placement and bonding of a third semiconductor device 1301 to the first semiconductor device 601 through the polymer layer 105. In an embodiment the third semiconductor device 1301 is used to work in conjunction with the first semiconductor device 601 and the second semiconductor device 603 in order to provide the desired functionality to the end user.

In a particular embodiment the third semiconductor device 1301 may be a memory device that may be used to provide stored data to either or both of the first semiconductor device 601 and the second semiconductor device 603. In such an embodiment the first semiconductor device 601 may comprise a memory control unit (not individually illustrated in FIG. 13) that provides a control functionality to the third semiconductor device 1301 in addition to other functionalities provided by the first semiconductor device

601. However, in other embodiments the third semiconductor device 1301 may comprise its own memory control unit.

In a particular embodiment in which the third semiconductor device 1301 is a memory device, the third semiconductor device 1301 may be a memory device with a high rate of data transfer, such as having a first rate of data transfer of between about 0.2 Gb/s and about 3.2 Gb/s, such as about 0.8 Gb/s. For example, the third semiconductor device 1301 may be a wide I/O RAM which has a large number of I/O interfaces, such as greater than 256 interfaces, so that a large bandwidth of data into and out of the third semiconductor device 1301 may be realized even at lower clock speeds. As such, the third semiconductor device 1301 may be used as a high-speed cache memory for the first semiconductor device 601 while helping to reduce the overall temperature of the first semiconductor device 601 and the second semiconductor device 603. However, the third semiconductor device 1301 may alternatively be any suitable type of memory device with a high rate of data transfer, such as an LPDDRn memory device or the like, that has a high rate of data transfer into and out of the third semiconductor device 1301.

In addition, because the second semiconductor device 603 has the TSVs 605, the third semiconductor device 1301 may also be used as a cache memory for the second semiconductor device 603 as well. In particular, the third semiconductor device 1301, under the control of the first semiconductor device 601, may output signals to the TSVs 605 located within the first semiconductor device 601, through the RDL 901, and to the second semiconductor device 603. By using the TSVs 605, a shorter and quicker path may be utilized to get the data from the third semiconductor device 1301 to the second semiconductor device 603, thereby making the overall device faster and more efficient.

In an embodiment the third semiconductor device 1301 comprises a third substrate, third active devices (such as an array of DRAM devices), third metallization layers, and third contact pads (all of which are not illustrated in FIG. 13 for clarity), which may be similar to the first substrate, the first active devices, the first metallization layers, and the first contact pads (described above with respect to FIG. 6). In an embodiment the third semiconductor device 1301 also comprises fourth external connections 1303 which may be formed as part of the third semiconductor device 1301 to provide connectivity between the third semiconductor device 1301 and the first semiconductor device 601. In an embodiment the fourth external connections 1303 may be, e.g., a copper pillar or copper post. However, the embodiments are not limited to these, and may alternatively be solder bumps, copper bumps, or other suitable fourth external connections 1303 that may be made to provide electrical connection. All such external contacts are fully intended to be included within the scope of the embodiments.

In an embodiment in which the fourth external connections 1303 are copper pillars, the fourth external connections 1303 may be formed by initially forming a seed layer (not individually illustrated in FIG. 13) over the seed layer. The seed layer is a thin layer of a conductive material that aids in the formation of a thicker layer during subsequent processing steps, and may comprise a layer of titanium about 500 Å thick followed by a layer of copper about 3,000 Å thick. The seed layer may be created using processes, such as sputtering, evaporation, or PECVD processes, depending upon the desired materials to a thickness of between about 0.1 μm and about 1 μm, such as about 0.3 μm.

The fourth external connections 1303 comprise one or more conductive materials, such as copper, tungsten, other conductive metals, or the like, and may be formed, for example, by electroplating, electroless plating, or the like. In an embodiment, an electroplating process is used wherein the third semiconductor device 1301 is submerged or immersed in an electroplating solution. The third semiconductor device 1301 surface is electrically connected to the negative side of an external DC power supply such that the third semiconductor device 1301 functions as the cathode in the electroplating process. A solid conductive anode, such as a copper anode, is also immersed in the solution and is attached to the positive side of the power supply. The atoms from the anode are dissolved into the solution, from which the cathode, e.g., the third semiconductor device 1301, acquires the dissolved atoms, thereby plating the exposed conductive areas of the third semiconductor device 1301, e.g., the exposed portions of the seed layer within the openings.

Once the fourth external connections 1303 have been formed, the third semiconductor device 1301 may be bonded to the first semiconductor device 601 by initially aligning the fourth external connections 1303 with the openings through the third passivation layer 903 and placing the fourth external connections 1303 in physical contact with the RDL layer 901. Once in contact, the fourth external connections 1303 may be bonded to the first semiconductor device 601 using a process such as thermo-compression bonding. Any suitable method of bonding, however, such as copper-copper bonding, may alternatively be utilized to bond the first semiconductor device 601 to the third semiconductor device 1301.

FIG. 14 illustrates a singulation of one section comprising a first one of the first semiconductor devices 601 and a first one of the second semiconductor devices 603 from a second section comprising a second one of the first semiconductor devices 601 and a second one of the second semiconductor devices 603. In an embodiment the singulation may be performed by using a saw blade (not shown) to slice through the encapsulant 701 and the polymer layer 105 between the vias 401, thereby separating one section from another to form a first package 1401 with the third semiconductor device 1301 connected to the first package 1401.

However, as one of ordinary skill in the art will recognize, utilizing a saw blade to singulate the first package 1401 is merely one illustrative embodiment and is not intended to be limiting. Alternative methods for singulating the first package 1401, such as utilizing one or more etches to separate the first package 1401, may alternatively be utilized. These methods and any other suitable methods may alternatively be utilized to singulate the first package 1401.

FIG. 15 illustrates a bonding of a second package 1501 to the first package 1401. In an embodiment the second package 1501 may be a package comprising a fourth semiconductor device 1503 and a fifth semiconductor device 1505 bonded on a packaging substrate 1507 using, e.g., a wire bonding technique. In an embodiment each of the fourth semiconductor device 1503 and the fifth semiconductor device 1505 may comprise a substrate, active devices, metallization layers, and contact pads, and these elements may be similar to the first substrate, first active devices, first metallization layers, and first contact pads described above with respect to the first semiconductor device 601.

In an particular embodiment the fourth semiconductor device 1503 and the fifth semiconductor device 1505 are devices that will be connected to the first package 1401 so that the fourth semiconductor devices 1503 and the fifth semiconductor device 1505 are used in conjunction with the first semiconductor device 601 and the second semiconductor device 603 to provide the desired functionality. In a particular embodiment the fourth semiconductor device 1503 and the fifth semiconductor device 1505 are memory devices that can be used to receive and supply data signals to and from the first semiconductor device 601 and the second semiconductor device 603.

Additionally, in an embodiment in which the third semiconductor device 1301 provides a high rate of data transfer, the fourth semiconductor device 1503 and the fifth semiconductor device 1505 may provide a lower rate of data transfer than the third semiconductor device 1301. In a particular embodiment in which the third semiconductor device 1301 is a wide I/O RAM or LPDDRn memory device, the fourth semiconductor device 1503 and the fifth semiconductor device 1505 may be a LPDDR memory device or a NAND flash memory device, although any other suitable type of memory device may alternatively be utilized.

For example, in an embodiment in which the third semiconductor device 1301 provides the first bandwidth of about 51.2 GB/s, the fourth semiconductor device 1503 and the fifth semiconductor device 1505 may provide a second bandwidth of between about 6.4 GB/s and about 25.6 GB/s, such as about 12.8 GB/s. As such, the fourth semiconductor device 1503 and the fifth semiconductor device 1505 can be used to store data where speed requirements may be more relaxed while the overall system can maintain desired high speeds by choosing (through the controller in the first semiconductor device 601) to store more speed sensitive data in the third semiconductor device 1301.

However, while the fourth semiconductor device 1503 and the fifth semiconductor device 1505 may have a second rate of data transfer that is lower than the first bandwidth, in an embodiment the fourth semiconductor device 1503 and the fifth semiconductor device 1505 also have a larger memory capacity than the third semiconductor device 1301. For example, in an embodiment in which the third semiconductor device 1301 has a first capacity of between about 128 KB and about 16 MB, such as about 256 KB, the fourth semiconductor device 1503 and the fifth semiconductor device 1505 (collectively) have a second capacity that is larger than the first capacity, such as by being between about 1 GB and about 16 GB, such as about 2 GB. As such, during operation the first semiconductor device 601 can utilize the best aspects of the third semiconductor device 1301 (e.g., speed), the fourth semiconductor device 1503 (e.g., capacity), and the fifth semiconductor device 1505 (e.g., capacity) in order to most efficiently utilize the various resources for an overall more efficient device.

In an embodiment the fourth semiconductor device 1503 and the fifth semiconductor device 1505 may be physically bonded together, and both of them may be bonded to the packaging substrate 1507. In an embodiment the packaging substrate 1507 includes one or more layers of a non-conductive material, such as a copper clad laminate (CCL) comprising a glass fabric that is coated with electrically insulating resin and is sandwiched between two copper foils, bismaleimide triazine (BT) resin, an epoxy-based resin, or a laminated material such as Ajinomoto Build-up Film (ABF) lamination by Ajinomoto, as examples. Alternatively, the packaging substrate 1507 may include other materials. The packaging substrate 1507 may include one or more redistribution layers (RDLs) having conductive wiring formed therein, not shown. The RDLs may include fan-out wiring that provides horizontal connections for the package in some embodiments, not shown. In some embodiments, an RDL is not included in the packaging substrate 1507.

Once the fourth semiconductor device 1503 and the fifth semiconductor device 1505 have been physically bonded to the packaging substrate 1507, the fourth semiconductor device 1503 and the fifth semiconductor device 1505 may be electrically connected to the packaging substrate 1507. In an embodiment the fourth semiconductor device 1503 and the fifth semiconductor device 1505 may be electrically connected through, e.g., a wire bonding process whereby contact pads on the fourth semiconductor device 1503 and the fifth semiconductor device 1505 are connected to contact pads on the packaging substrate 1507. However, any suitable method of electrically connecting the fourth semiconductor device 1503 and the fifth semiconductor device 1505 to the packaging substrate 1507, such as a flip-chip arrangement, may also be utilized.

Once connected, the fourth semiconductor device 1503 and the fifth semiconductor device 1505 may be encapsulated with a second encapsulant 1511. In an embodiment the fourth semiconductor device 1503 and the fifth semiconductor device 1505 may be encapsulated in a method similar to the encapsulation of the first semiconductor device 601 and the second semiconductor device 603 (described above with respect to FIG. 7). However, the fourth semiconductor device 1503 and the fifth semiconductor device 1505 may also be encapsulated in a different method.

In an embodiment the second package 1501 comprises fifth external connections 1509 to provide connectivity between the second package 1501 and the first package 1401 through the vias 401. The fifth external connections 1509 may be contact bumps such as microbumps or controlled collapse chip connection (C4) bumps and may comprise a material such as tin, or other suitable materials, such as silver or copper. In an embodiment in which the fifth external connections 1509 are tin solder bumps, the fifth external connections 1509 may be formed by initially forming a layer of tin through any suitable method such as evaporation, electroplating, printing, solder transfer, ball placement, etc, to a preferred thickness of about 100 µm. Once a layer of tin has been formed on the structure, a reflow is preferably performed in order to shape the material into the desired bump shape.

Once the fifth external connections 1509 have been formed, the second package 1501 may be bonded to the first package 1401 by initially aligning the fifth external connections 1509 with the openings through the third passivation layer 903 that expose the vias 401 and placing the fifth external connections 1509 in physical contact with the vias 401. Once in contact, a reflow may be performed to reflow the material of the fifth external connections 1509 and bond to the vias 401. Any suitable method of bonding, however, such as copper-copper bonding, may alternatively be utilized to bond the second package 1501 to the first package 1401.

In operation, the first semiconductor device 601 may be used to control the storing and retrieval of data from the third semiconductor device 1301 and the second package 1501. For example, for a first data set where it is desirable to store and retrieve such data quickly, the first semiconductor device 601 may decide to store such data within the third semiconductor device 1301. In contrast, for a second data set, in which speed may not be as critical, the first semiconductor device 601 may make the decision to store and retrieve the second data set in the second package 1501. This allows the first semiconductor device 601 to efficiently route and control the storage and retrieval of data into and out of a memory device.

Figure 16A:
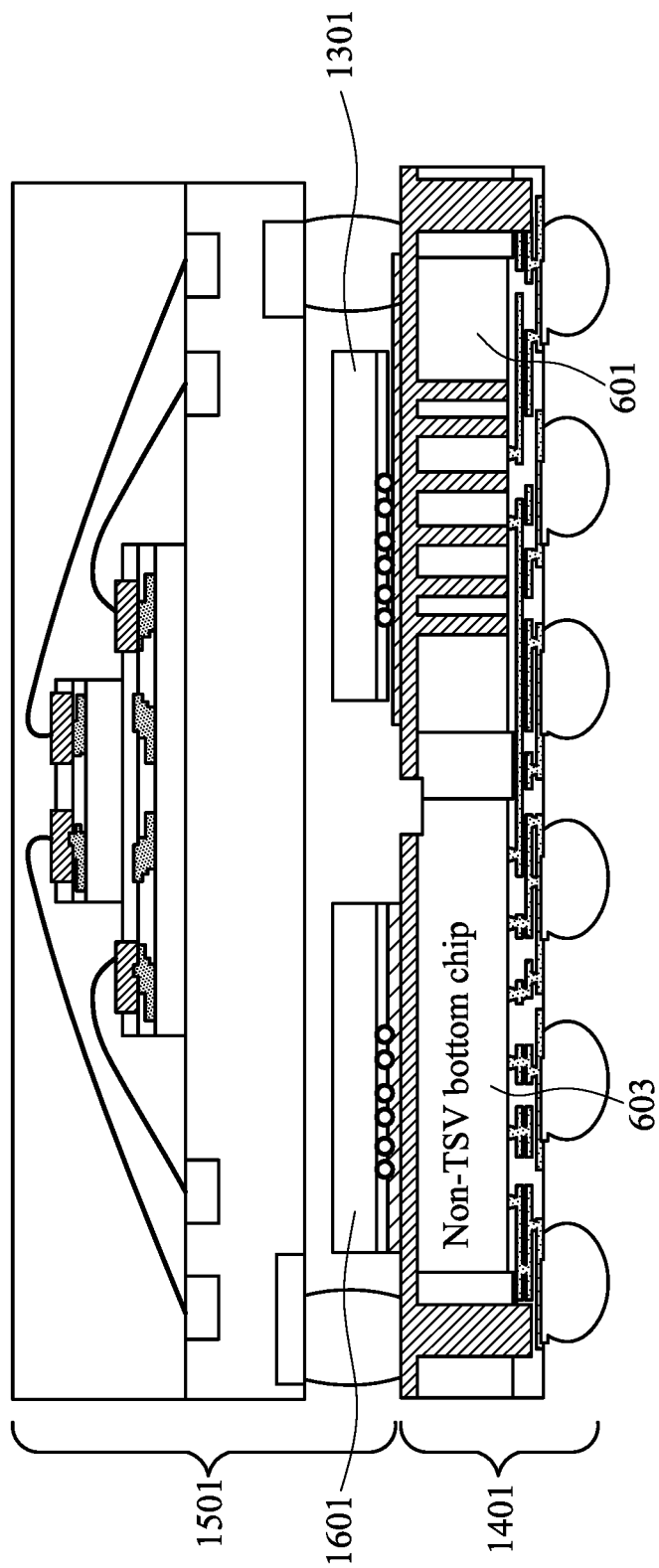
FIGS. 16A-16C disclose additional embodiments of chip on package structures in accordance with embodiments.
Figure 16B:
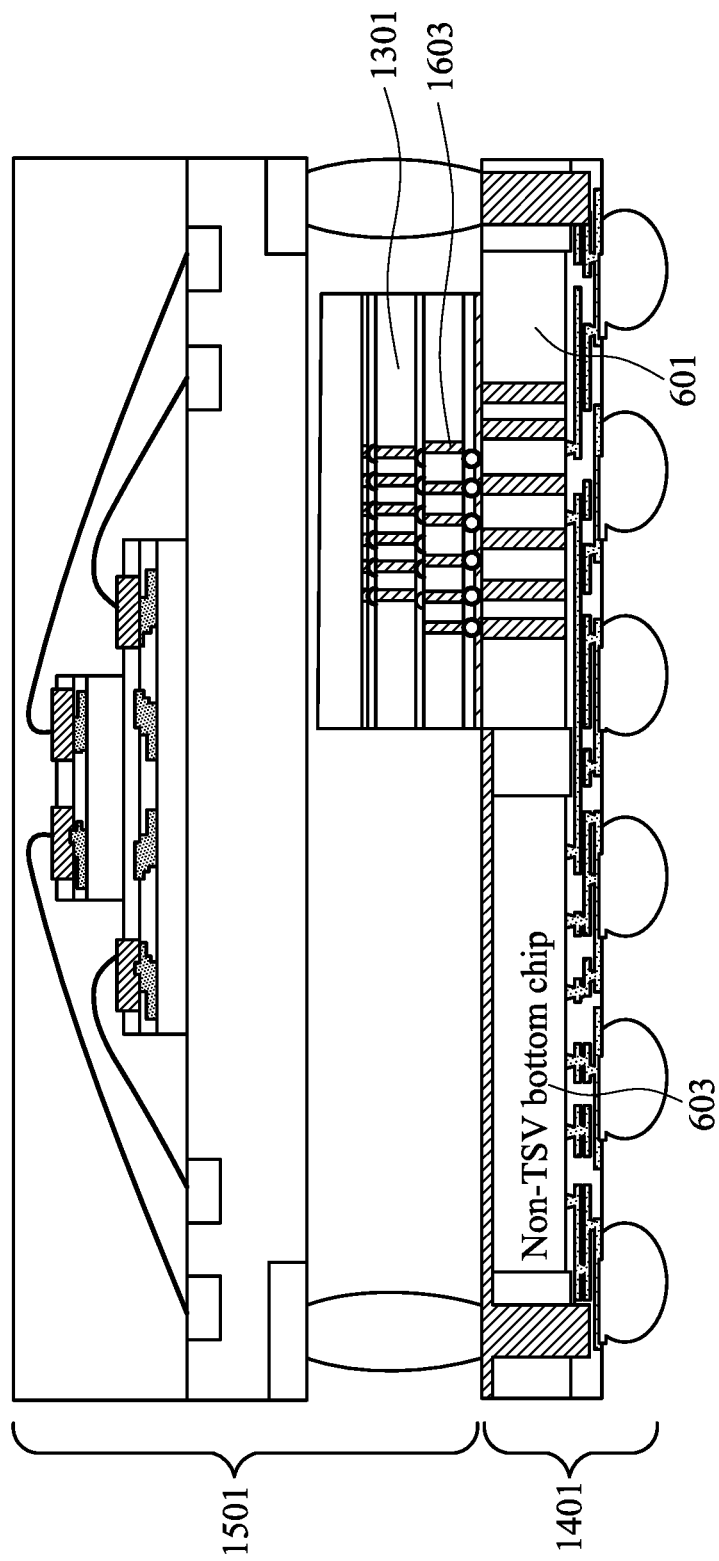
Figure 16C:
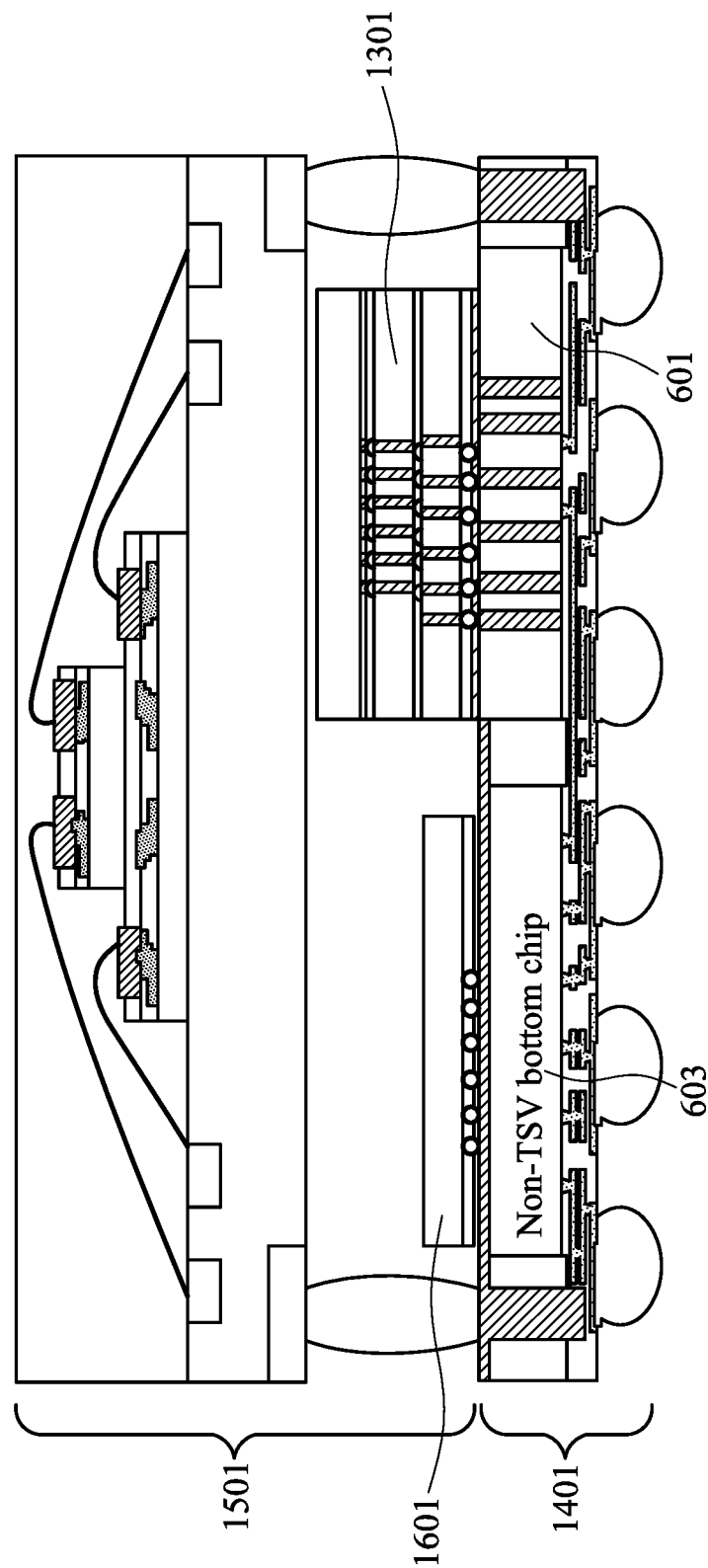

FIGS. 16A-16C illustrate additional embodiments of the chip on package configuration. FIG. 16A illustrates an embodiment similar to the embodiment described above with respect to FIG. 15. However, in addition to the third semiconductor device 1301 being located between the first package 1401 and the second package 1501, a sixth semiconductor device 1601 is additionally connected to the second semiconductor device 603 between the first package 1401 and the second package 1501.

In this embodiment the sixth semiconductor device 1601 may be similar to the third semiconductor device 1301, such as by being a wide I/O RAM or a LPDDRn memory device with a capacity of between about 128 KB and about 16 MB, such as about 256 KB. The sixth semiconductor device 1601 may be connected to the second semiconductor device 603 in a similar fashion as the third semiconductor device 1301 is connected to the first semiconductor device 601 (e.g., by laser drilling openings through the polymer layer 105 and then bonding the sixth semiconductor device 1601 to the second semiconductor device 603 through the polymer layer 105. However, in this embodiment, in addition to receiving signals from the third semiconductor device 1301, the second semiconductor device 603 may also receive high-speed signals directly from the sixth semiconductor device 1601, thereby allowing an even more efficient distribution of storage functions.

FIG. 16B illustrates another embodiment in which, instead of having a single third semiconductor device 1301 attached to the first semiconductor device 601, a plurality of the third semiconductor devices 1301 in a die stack configuration are attached to the first semiconductor device 601. In this embodiment the plurality of third semiconductor devices 1301 may be interconnected with each other and to the first semiconductor device 601 using, e.g., second through substrate vias 1603 that extend through the various third semiconductor devices 1301 so that power, ground and signals may be passed between the plurality of third semiconductor devices 1301 as well as passed between the plurality of third semiconductor devices 1301 and the first semiconductor device 601. In an embodiment the second TSVs 1603 may be formed in a similar manner as the TSVs 605 within the first semiconductor device 601 (as described above with respect to FIG. 6), although the second TSVs 1603 may alternatively be formed in a different manner than the TSVs 605.

FIG. 16C illustrates an embodiment similar to the embodiment described above with respect to FIG. 16B, in which a plurality of third semiconductor devices 1301 are stacked together and connected to the first semiconductor device 601. In this embodiment, however, in addition to the plurality of third semiconductor device 1301, the sixth semiconductor device 1601 is additionally connected to the second semiconductor device 603 as described above with respect to FIG. 16A.

By packaging semiconductor devices as provided in the above paragraphs, communication speeds from an application processor to a memory can be improved with a low cost process. Additionally, the first package 1401, which is in an Integrated fan out package (InFO) configuration, can be a "Known-Good-Package," which is better than the application processor in a 3D-IC with TSV configuration. This also provides for a smaller form factor than a flip chip package on package (FC_POP) confiugration, similar to 3D-IC, and provides more high-speed for application processor. Finally, this process and structure reduces the total number of components and enhances the reliability.

In accordance with an embodiment, a method for packaging semiconductor devices method comprising forming vias over a carrier wafer and attaching a first die over the carrier wafer, the first die comprising a plurality of through silicon vias, is provided. A second die is attached over the carrier wafer, and the first die, the second die, and the vias are encapsulated to form a first package. The carrier wafer is removed, and a third die is connected to a first side of the first package, wherein the third die is electrically connected to the plurality of through silicon vias. A second package is connected to the first side of the first package, wherein the third die is located between the first die and the second die.

In accordance with another embodiment, a method of manufacturing a semiconductor device comprising connecting a first semiconductor device to a first package is provided. The first package comprises a second semiconductor device, the second semiconductor device comprising a plurality of through silicon vias, wherein the first semiconductor device is located over the second semiconductor device; a third semiconductor device, wherein the third semiconductor device is electrically connected to the second semiconductor device and does not have a through silicon via; an encapsulant encapsulating the second semiconductor device and the third semiconductor device; and vias extending all of the way through the encapsulant. A second package is connected to the vias, wherein the second package is over the first semiconductor device and the second semiconductor device.

In accordance with yet another embodiment, a semiconductor device comprising a first semiconductor device with through silicon vias, wherein the first semiconductor device has a first height, and a second semiconductor device without through silicon vias, and vias having a second height at least as large as the first height is provided. A redistribution layer is in electrical connection with the first semiconductor device, the second semiconductor device, and the vias. A third semiconductor device is over the first semiconductor device, the third semiconductor device comprising electrical connections connected to the through silicon vias, and a package is connected to the vias, wherein the third semiconductor device is located between the first semiconductor device and the package.

Although the present invention and its advantages have been described in detail, it should be understood that various changes, substitutions and alterations can be made herein without departing from the spirit and scope of the invention as defined by the appended claims. For example, the various chips may provide any suitable or desired functionality alternatively to the functionalities described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   encapsulating a first semiconductor device, a second semiconductor device, and a via with an encapsulant;
   planarizing the encapsulant to expose the first semiconductor device and the via; and
   electrically connecting a third semiconductor device to the second semiconductor device through the first semiconductor device and a redistribution layer, the redistribution layer being located on an opposite side of the first semiconductor device than the third semiconductor device, wherein the first semiconductor device comprises through vias electrically connecting the third semiconductor device to the redistribution layer; and
   electrically connecting a fourth semiconductor die located over the second semiconductor device, wherein the fourth semiconductor die comprises a memory with a data transfer rate less than the third semiconductor device.

2. The method of claim 1, wherein the first semiconductor device is a 28 nm node device and the second semiconductor device is a 16 nm node device.

3. The method of claim 1, wherein the third semiconductor device is a memory device.

4. The method of claim 3, wherein the memory device has a data transfer rate of between about 0.2 Gb/s and about 3.2 Gb/s.

5. The method of claim 3, wherein the memory device is a cache memory for the second semiconductor device.

6. The method of claim 1, wherein the fourth semiconductor die has a bandwith of between about 6.4 GB/s and about 25.6 GB/s.

7. The method of claim 1, wherein the third semiconductor device is a LPDDRn memory device.

8. The method of claim 1, wherein the second semiconductor device has a hybrid configuration.

9. A method of manufacturing a semiconductor device, the method comprising:
   forming at least one via over a substrate;
   placing a first semiconductor device adjacent to the at least one via;
   placing second semiconductor device adjacent to the first semiconductor device;
   placing an encapsulant around the at leasst one via, the first semiconductor device, and the second semiconductor device;
   exposing the at least one via and the first semiconductor device;
   electrically connecting the at least one via, the first semiconductor device, and the second semiconductor device with a redistribution layer; and
   physically attaching a third semiconductor device to the first semiconductor device, wherein the third semiconductor device is electrically connected to the redistribution layer through second vias, the second vias extending through the first semiconductor device.

10. The method of claim 9, wherein the second semiconductor device has a first operating speed, the first semiconductor device has a second operating speed, and the first operating speed is larger than the second operating speed.

11. The method of claim 9, wherein the third semiconductor device is an LPDDRn memory device.

12. The method of claim 9, further comprising connecting a fourth semiconductor device to the at least one via.

13. The method of claim 12, wherein the fourth semiconductor device is an LPDDR memory device.

14. The method of claim 13, wherein the LPDDR memory device has a bandwidth of between about 6.4 GB/s and about 25.6 GB/s.

15. The method of claim 9, further comprising:
    connecting a fourth semiconductor device to the at least one via; and
    connecting a fifth semiconductor device to the fourth semiconductor device and the at least one via.

16. The method of claim 15, wherein both of the fourth semiconductor device and the fifth semiconductor device has a capacity larger than the third semiconductor device.

17. A method of manufacturing a semiconductor device, the method comprising:
    forming an integrated fan out package, the integrated fan out package comprising a first semiconductor device, a second semiconductor device, and a via, the via having a first height at least as large as a second height of the first semiconductor device;
    attaching a third semiconductor device to the integrated fan out package, wherein the third semiconductor device is onnected to the second semiconductor device by though vias located within the first semiconductor device; and
    attaching a fourth semiconductor device to the integrated fan out package, the fourth semiconductor device having a first bandwidth, wherein the third semiconductor device has a second bandwidth greater than the first bandwidth.

18. The method of claim 17, wherein the first semiconductor device has a hybrid configuration.

19. The method of claim 18, wherein the hybrid configuration comprises an analog region and a digital region.

20. The method of claim 17, wherein the second bandwidth is about 51.2 GB/s and the first bandwidth is between about 6.4 GB/s and about 25.6 GB/s.

* * * * *

UNITED STATES PATENT AND TRADEMARK OFFICE
CERTIFICATE OF CORRECTION

PATENT NO. : 10,964,666 B2  
APPLICATION NO. : 15/645487  
DATED : March 30, 2021  
INVENTOR(S) : Chen-Hua Yu et al.

Page 1 of 1

It is certified that error appears in the above-identified patent and that said Letters Patent is hereby corrected as shown below:

In the Claims

In Column 17, Line 7, Claim 1, delete "device and the via; and" and insert --device and the via;--.

In Column 17, Line 21, Claim 2, delete "wherein the first semiconductor" and insert --wherein the second semiconductor--.

In Column 17, Line 22, Claim 2, delete "and the second semiconductor" and insert --and the first semiconductor--.

In Column 17, Line 32, Claim 6, delete "bandwith" and insert --bandwidth--.

In Column 17, Line 43, Claim 9, delete "placing second" and insert --placing a second--.

In Column 17, Line 45, Claim 9, delete "leasst" and insert --least--.

In Column 18, Line 26, Claim 16, delete "has a capacity" and insert --have a capacity--.

In Column 18, Line 36, Claim 17, delete "onnected" and insert --connected--.

In Column 18, Line 37, Claim 17, delete "though" and insert --through--.

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*